(12) United States Patent
Blin

(10) Patent No.: US 12,556,084 B2
(45) Date of Patent: Feb. 17, 2026

(54) CHARGING AND DISCHARGING CIRCUITS FOR ASSISTING CHARGE PUMPS

(71) Applicant: Skyworks Solutions, Inc., Irvine, CA (US)

(72) Inventor: Guillaume Alexandre Blin, Carlisle, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 150 days.

(21) Appl. No.: 18/610,644

(22) Filed: Mar. 20, 2024

(65) Prior Publication Data

US 2024/0223079 A1 Jul. 4, 2024

Related U.S. Application Data

(63) Continuation of application No. 17/935,436, filed on Sep. 26, 2022, now Pat. No. 11,967,896.

(60) Provisional application No. 63/262,399, filed on Oct. 12, 2021.

(51) Int. Cl.
*H02M 3/07* (2006.01)
*H03F 3/195* (2006.01)
*H03F 3/24* (2006.01)

(52) U.S. Cl.
CPC .............. *H02M 3/07* (2013.01); *H03F 3/195* (2013.01); *H03F 3/245* (2013.01); *H03F 2200/451* (2013.01)

(58) Field of Classification Search
CPC ........ H02M 3/07; H02M 3/071; H02M 3/073; H02M 3/1566; H02M 1/0045
See application file for complete search history.

(56) References Cited

U.S. PATENT DOCUMENTS

| | | | |
|---|---|---|---|
| 6,466,069 B1 | 10/2002 | Rozenblit et al. | |
| 6,611,160 B1 | 8/2003 | Lee et al. | |
| 6,954,090 B2 | 10/2005 | Lee et al. | |
| 8,598,946 B2 | 12/2013 | Drost et al. | |
| 9,083,455 B2 | 7/2015 | Popplewell et al. | |
| 9,391,648 B2 | 7/2016 | Popplewell et al. | |
| 9,425,833 B2 | 8/2016 | Popplewell et al. | |
| 9,467,124 B2 | 10/2016 | Crandall | |
| 9,577,626 B2 * | 2/2017 | Crandall | H03K 17/04123 |
| 9,678,528 B2 | 6/2017 | Ripley | |
| 9,698,832 B2 | 7/2017 | Popplewell et al. | |
| 9,729,048 B2 | 8/2017 | Crandall et al. | |
| 9,847,774 B2 | 12/2017 | Crandall et al. | |
| 10,050,522 B2 | 8/2018 | Scheel | |
| 10,103,726 B2 | 10/2018 | Wilz et al. | |

(Continued)

*Primary Examiner* — Sibin Chen
(74) *Attorney, Agent, or Firm* — Knobbe, Martens, Olson & Bear, LLP

(57) ABSTRACT

Charging and discharging circuits for assisting charge pumps are disclosed. In certain embodiments, a radio frequency (RF) switch system includes an RF switch that receives an RF signal and is controlled by a switch control signal received at an input, a first charge pump configured to generate a first charge pump voltage, a level shifter powered by the first charge pump voltage and that generates the switch control signal based on a switch enable signal, and a charge pump assistance switch coupled to the input of the radio frequency switch and that activates to assist the first charge pump in response to a transition of the switch enable signal from a first state to a second state.

20 Claims, 14 Drawing Sheets

(56) References Cited

U.S. PATENT DOCUMENTS

| | | |
|---|---|---|
| 10,365,680 B2 | 7/2019 | Ripley |
| 10,447,151 B2 | 10/2019 | Zhou et al. |
| 10,483,843 B2 | 11/2019 | Crandall et al. |
| 10,523,115 B2 | 12/2019 | Scheel |
| 10,547,305 B2 | 1/2020 | Wilz et al. |
| 10,680,516 B2 | 6/2020 | Crandall et al. |
| 11,137,790 B2 | 10/2021 | Ripley |
| 11,190,182 B2 | 11/2021 | Balteanu et al. |
| 11,374,491 B2 | 6/2022 | Lam |
| 11,431,357 B2 | 8/2022 | Balteanu et al. |
| 11,967,896 B2 | 4/2024 | Blin |
| 2011/0187417 A1* | 8/2011 | Kim .................... H03K 17/102 327/109 |
| 2015/0372590 A1* | 12/2015 | Seshita .................... H03K 5/08 327/536 |
| 2016/0094207 A1 | 3/2016 | Crandall |
| 2018/0145679 A1 | 5/2018 | Kim et al. |
| 2020/0161965 A1 | 5/2020 | Zhou et al. |
| 2020/0228006 A1 | 7/2020 | Scheel |
| 2021/0028800 A1* | 1/2021 | Balteanu .............. H04B 1/0078 |
| 2022/0085808 A1 | 3/2022 | Balteanu et al. |
| 2022/0147092 A1 | 5/2022 | Ripley |
| 2022/0286047 A1 | 9/2022 | Lam |

\* cited by examiner

CHARGING AND DISCHARGING CIRCUITS FOR ASSISTING CHARGE PUMPS

CROSS-REFERENCE TO RELATED APPLICATIONS

This application is a continuation of U.S. application Ser. No. 17/935,436, filed Sep. 26, 2022 and titled "CHARGING AND DISCHARGING CIRCUITS FOR ASSISTING CHARGE PUMPS," which claims the benefit of priority under 35 U.S.C. § 119 of U.S. Provisional Patent Application No. 63/262,399, filed Oct. 12, 2021 and titled "CHARGING AND DISCHARGING CIRCUITS FOR ASSISTING CHARGE PUMPS," which is herein incorporated by reference in its entirety.

BACKGROUND

Field

Embodiments of the invention relate to electronic systems, and in particular, to radio frequency (RF) communication systems.

Description of the Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a power management system including a first charge pump configured to generate a first charge pump voltage. The mobile device further includes a front end system including a radio frequency switch configured to receive a radio frequency signal and to be controlled by a switch control signal received at an input, a level shifter powered by the first charge pump voltage and configured to generate the switch control signal based on a switch enable signal, and a charge pump assistance switch coupled to the input of the radio frequency switch and configured to activate to assist the first charge pump in response to a transition of the switch enable signal from a first state to a second state.

In various embodiments, the charge pump assistance switch is activated by a signal pulse generated by the level shifter. According to a number of embodiments, the level shifter is configured to have a high output impedance during at least a portion of the signal pulse.

In several embodiments, the front end system further includes one or more resistors connected between an output of the level shifter and the input of the radio frequency switch. According to a number of embodiments, the one or more resistors includes a first resistor and a second resistor in series and connected to one another at a tap node, the charge pump assistance switch connected to the tap node.

In some embodiments, the first charge pump voltage is a negative voltage less than a ground voltage, and the charge pump assistance switch is coupled between the input of the radio frequency switch and the ground voltage. According to a number of embodiments, the front end system further includes a diode in series with the charge pump assistance switch. In accordance with various embodiments, the power management system further includes at least one of a positive charge pump or a low dropout regulator configured to power the level shifter with a positive voltage. According to several embodiments, the front end system further includes a charging assistance switch coupled to the input of the radio frequency switch and configured to activate in response to the switch enable signal transitioning from the second state to the first state. In accordance with a number of embodiments, the radio frequency switch includes at least one field-effect transistor having a gate connected to the input.

In certain embodiments, a radio frequency switch system is provided. The radio frequency switch system includes a radio frequency switch configured to receive a radio frequency signal and to be controlled by a switch control signal received at an input, a first charge pump configured to generate a first charge pump voltage, a level shifter powered by the first charge pump voltage and configured to generate the switch control signal based on a switch enable signal, and a charge pump assistance switch coupled to the input of the radio frequency switch and configured to activate to assist the first charge pump in response to a transition of the switch enable signal from a first state to a second state.

In various embodiments, the charge pump assistance switch is activated by a signal pulse generated by the level shifter. According to a number of embodiments, the level shifter is configured to have a high output impedance during at least a portion of the signal pulse.

In several embodiments, the radio frequency switch system further includes one or more resistors connected between an output of the level shifter and the input of the radio frequency switch. According to a number of embodiments, the one or more resistors includes a first resistor and a second resistor in series and connected to one another at a tap node, the charge pump assistance switch connected to the tap node.

In some embodiments, the first charge pump voltage is a negative voltage less than a ground voltage, and the charge pump assistance switch is coupled between the input of the radio frequency switch and the ground voltage. According to a number of embodiments, the radio frequency switch system further includes a diode in series with the charge pump assistance switch. In accordance with several embodiments, the diode is implemented as a diode-connected field effect transistor and the charge pump assistance switch is implemented as a switch field effect transistor. According to various embodiments, a body of the diode-connected field effect transistor is electrically floating and a body of the switch field effect transistor is connected to ground. In accordance with a number of embodiments, the radio frequency switch system further includes at least one of a positive charge pump or a low dropout regulator configured to power the level shifter with a positive voltage. According to several embodiments, the radio frequency switch system further includes a charging assistance switch coupled to the input of the radio frequency switch and configured to activate in response to the switch enable signal transitioning from the second state to the first state.

In various embodiments, the radio frequency switch includes at least one field-effect transistor having a gate connected to the input.

In certain embodiments, a method of level shifting in a mobile device is provided. The method includes generating a first charge pump voltage using a first charge pump, providing a switch control signal from an output of a level shifter to an input of a radio frequency switch, the switch control signal generated based on a switch enable signal received by the level shifter, powering the level shifter with the first charge pump voltage, and activating a charge pump assistance switch coupled to the input of the radio frequency switch in response to a transition of the switch enable signal from a first state to a second state.

In some embodiments, the method further includes activating the charge pump assistance switch with a signal pulse generated by the level shifter. According to a number of embodiments, the method further includes providing a high output impedance to the level shifter during at least a portion of the signal pulse.

DETAILED DESCRIPTION OF EMBODIMENTS

Figure 1:
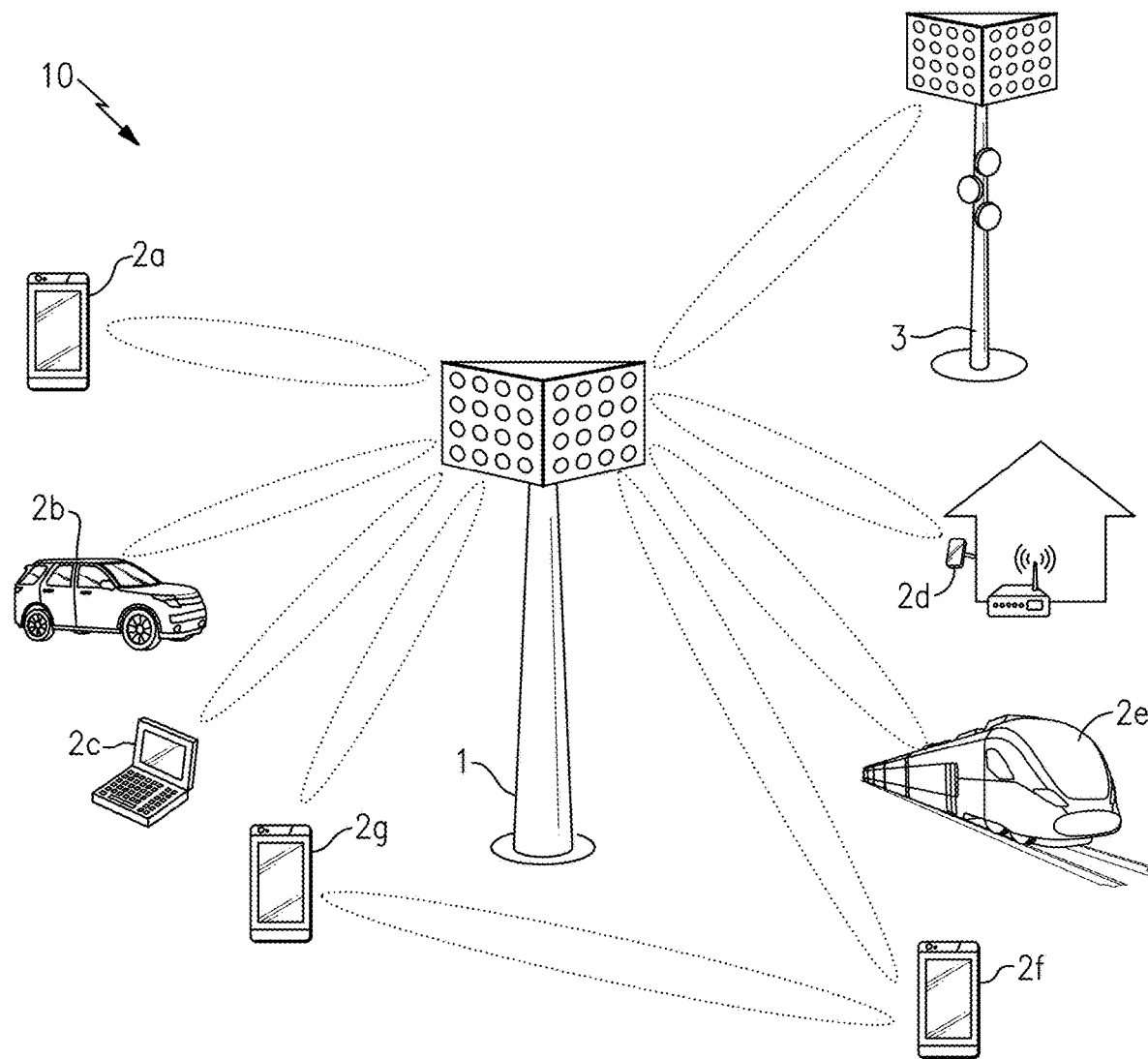
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15 and Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof.

For example, 5G NR can operate with different specifications across frequency bands for 5G, including with flexible numerology compared with fixed numerology for 4G. FR1 includes existing and new bands and corresponds to 450 MHz-6 GHZ; sub-6 GHZ bands with numerology subcarrier spacing of 15 kHz, 30 kHz and 60 kHz. Additionally, FR2 includes new bands and corresponds to millimeter wave frequencies of 24.25 GHZ-52.6 GHZ with numerology subcarrier spacing of 60 kHz, 120 kHz and 240 kHz to be able to handle higher phase noise and Doppler effects (for instance, for train applications up to 500 km/h).

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHZ), FR2-2 (52 GHz to 71 GHZ), and/or FR1 (400 MHz to 7125 MHZ).

In one embodiment, one or more of the mobile devices support a HPUE power class specification.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IOT) applications.

The communication network 10 of FIG. 1 can be used to support a wide variety of advanced communication features, including, but not limited to, eMBB, uRLLC, and/or mMTC.

Figure 2A:
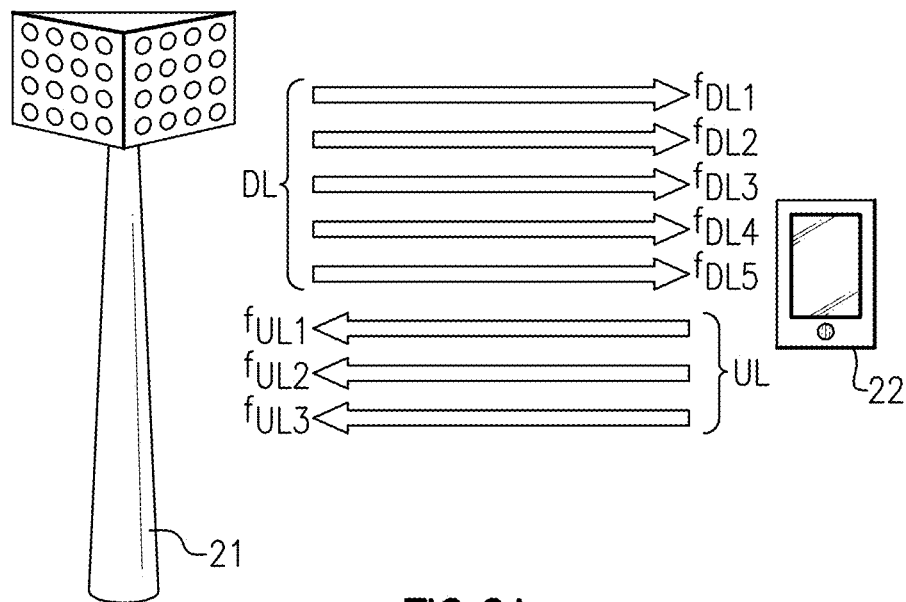
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
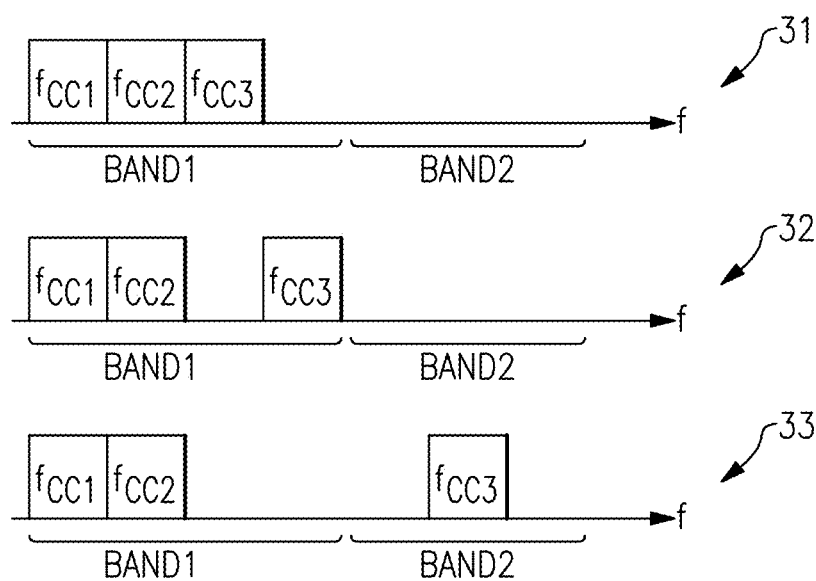
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
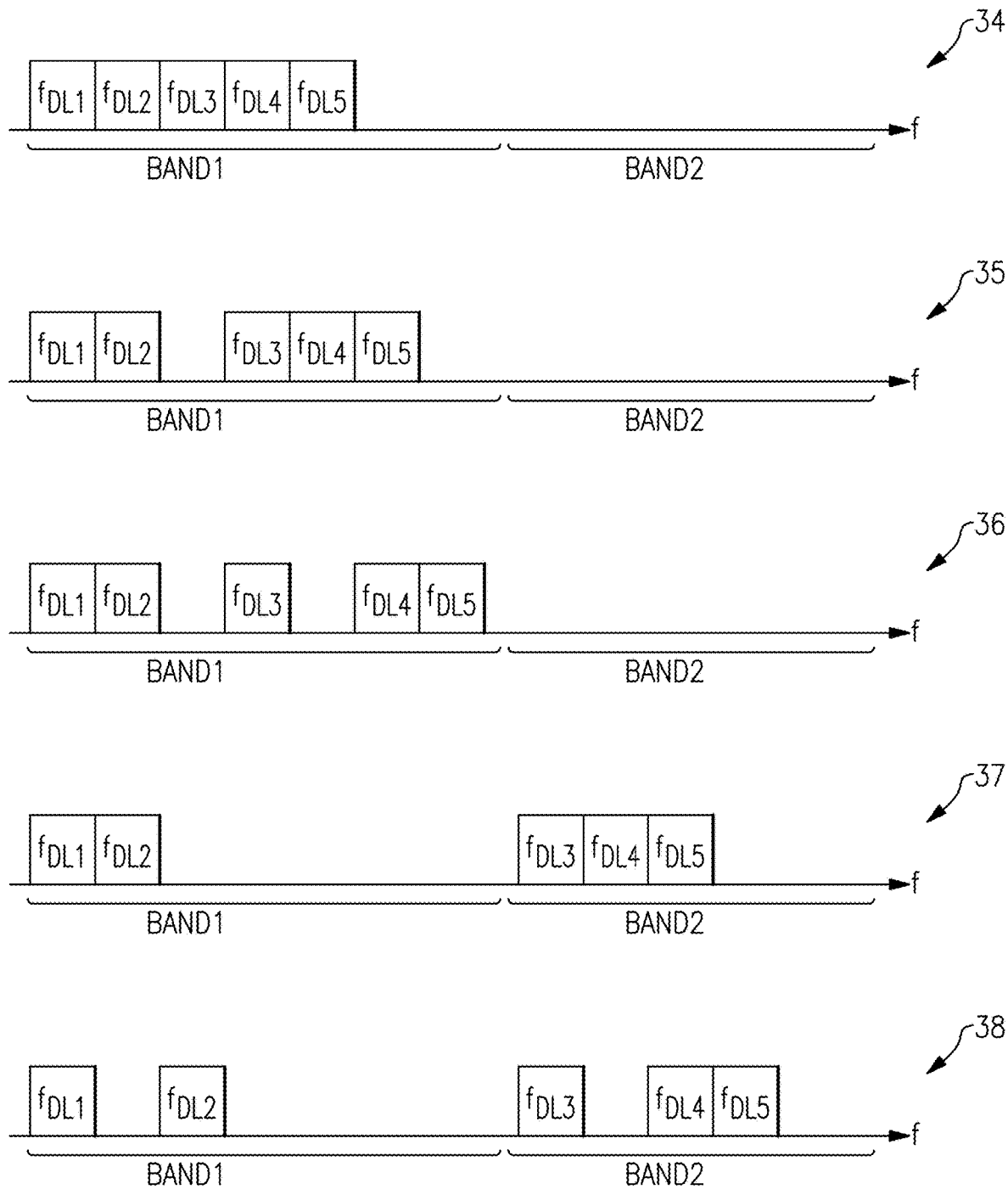
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHZ) and/or a 6 GHz band (5925 MHz to 7125 MHz).

Figure 3A:
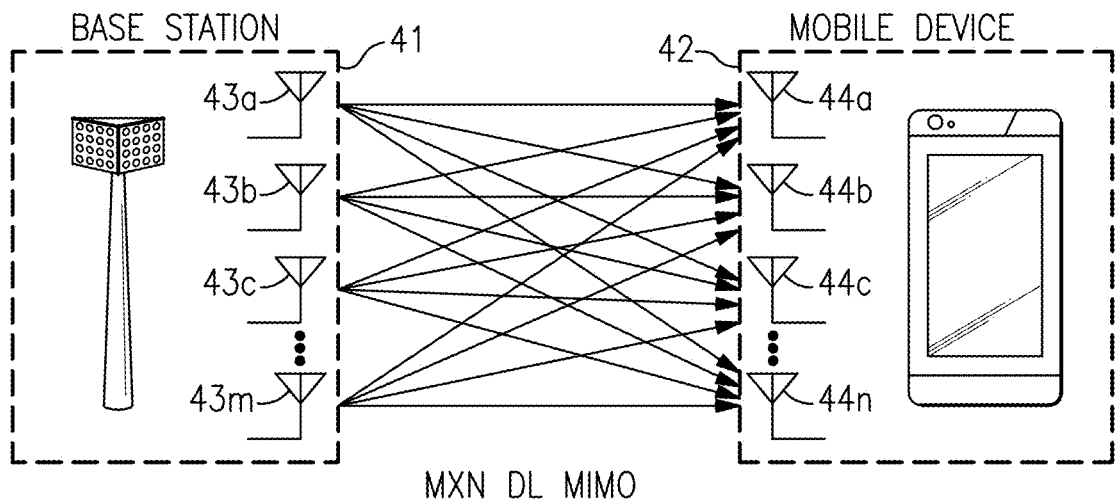
FIG. 3A is a schematic diagram of one example of a downlink channel using multi-input and multi-output (MIMO) communications.
Figure 3B:
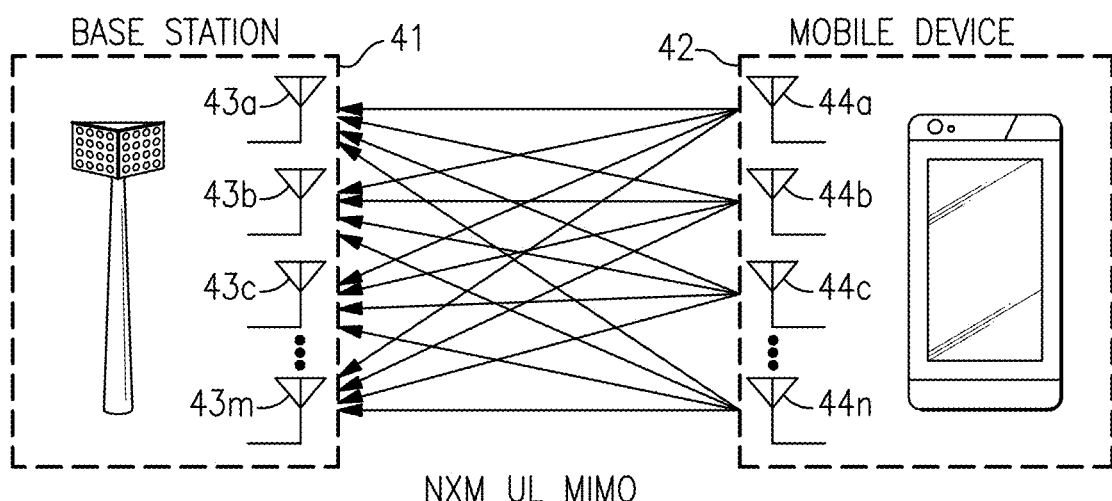
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43$a$, 43$b$, 43$c$, . . . 43$m$ of the base station 41 and receiving using N antennas 44$a$, 44$b$, 44$c$, . . . 44$n$ of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44$a$, 44$b$, 44$c$, . . . 44$n$ of the mobile device 42 and receiving using M antennas 43$a$, 43$b$, 43$c$, . . . 43$m$ of the base station 41. Accordingly, FIG. 3B illustrates an example of n×m UL MIMO.

By increasing the level or order of MIMO, data bandwidth of an uplink channel and/or a downlink channel can be increased.

MIMO communications are applicable to communication links of a variety of types, such as FDD communication links and TDD communication links.

Figure 3C:
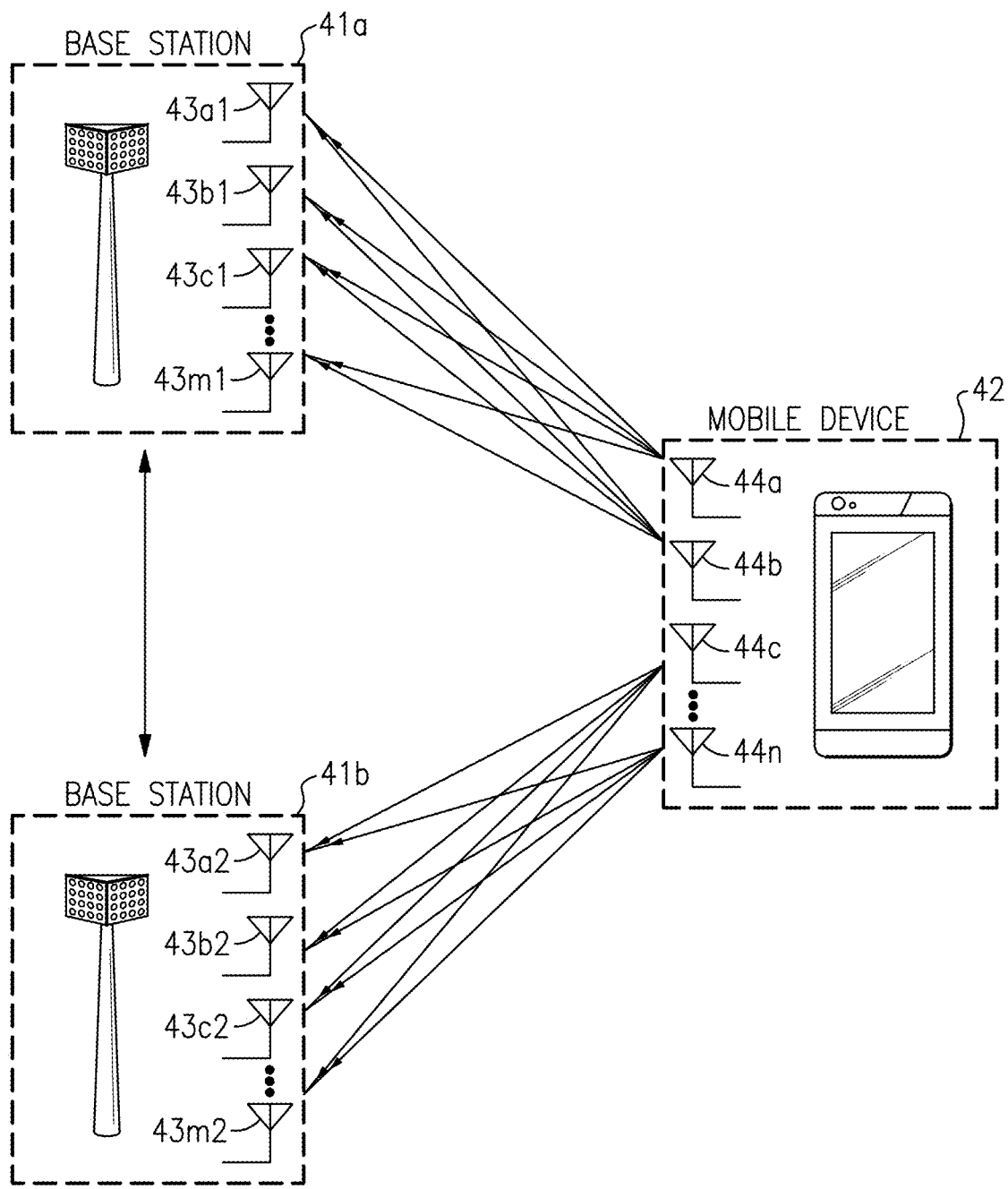
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44$a$, 44$b$, 44$c$, . . . 44$n$ of the mobile device 42. Additional a first portion of the uplink transmissions are received using M antennas 43$a$1, 43$b$1, 43$c$1, . . . 43$m$1 of a first base station 41$a$, while a second portion of the uplink transmissions are received using M antennas 43$a$2, 43$b$2, 43$c$2, . . . 43$m$2 of a second base station 41$b$. Additionally, the first base station 41$a$ and the second base station 41$b$ communication with one another over wired, optical, and/or wireless links.

The MIMO scenario of FIG. 3C illustrates an example in which multiple base stations cooperate to facilitate MIMO communications.

Figure 4:
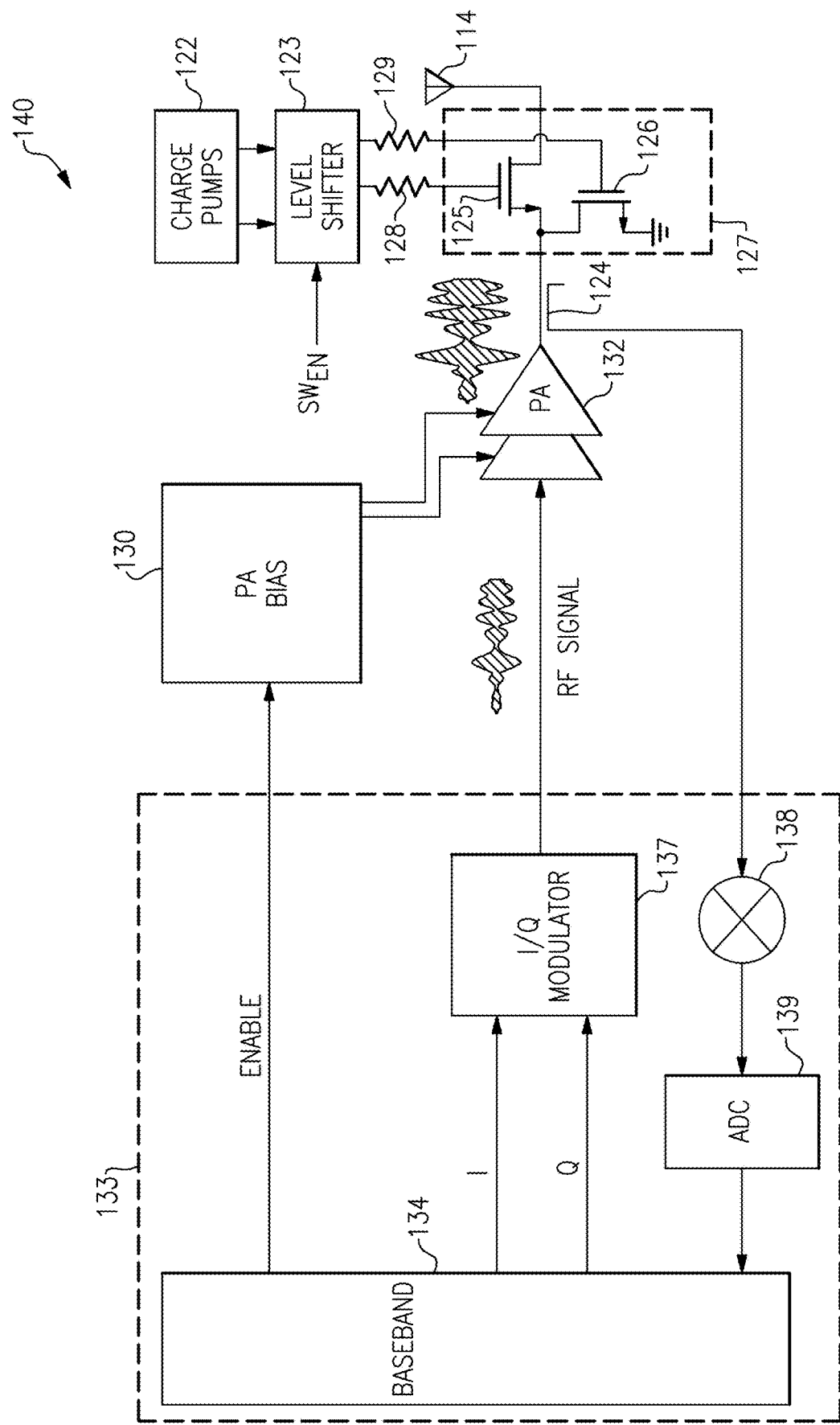
FIG. 4 is a schematic block diagram of one embodiment of a power amplifier system.

FIG. 4 is a schematic block diagram of one embodiment of a power amplifier system 140. The illustrated power amplifier system 140 includes an RF switching circuit 127 that includes a series switch transistor 125 and a shunt switch transistor 126. The illustrated power amplifier system 140 further includes charge pumps 122, a level shifter 123, a directional coupler 124, a first gate resistor 128, a second gate resistor 129, a power amplifier bias circuit 130, a power amplifier 132, and a transmitter 133. The illustrated transmitter 133 includes a baseband processor 134, an I/Q modulator 137, a mixer 138, and an analog-to-digital converter (ADC) 139. Although not illustrated in FIG. 4 for clarity, the transmitter 133 can include circuitry associated with receiving signals over one or more receive paths such that transceiver functionality is achieved.

The baseband signal processor 134 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 137 in a digital format. The baseband processor 134 can be any suitable processor configured to process a baseband signal. For instance, the baseband processor 134 can include a digital signal processor, a microprocessor, a programmable core, or any combination thereof. Moreover, in some implementations, two or more baseband processors 134 can be included in the power amplifier system 140.

The I/Q modulator 137 can be configured to receive the I and Q signals from the baseband processor 134 and to process the I and Q signals to generate an RF signal. For example, the I/Q modulator 137 can include DACs configured to convert the I and Q signals into an analog format, mixers for upconverting the I and Q signals to radio frequency, and a signal combiner for combining the upconverted I and Q signals into an RF signal suitable for amplification by the power amplifier 132. In certain implementations, the I/Q modulator 137 can include one or more filters configured to filter frequency content of signals processed therein.

The power amplifier bias circuit 130 can receive one or more control signals from the baseband processor 134, which can be used to generate one or more bias signals for the power amplifier 132. The control signals can include, for example, bias settings or levels and/or enable functionality. The power amplifier 132 can receive the RF signal from the I/Q modulator 137 of the transmitter 133.

The level shifter 123 can turn on and off the series switch transistor 125 and the shunt switch transistor 126 in a complementary manner. For example, the level shifter 123 can be used to turn on the series switch transistor 125 and turn off the shunt switch transistor 126 such that the power amplifier 132 provides an amplified RF signal to the antenna 114 through the series switch transistor 125. Additionally, the level shifter 123 can be used to turn off the series switch transistor 125 and turn on the shunt switch transistor 126 to provide a high impedance path between the output of the power amplifier 132 and the antenna 114 while providing termination to the power amplifier's output. To control a state of the RF switching circuit 127, the level shifter 123 can receive a switch enable signal $SW_{EN}$ from any suitable circuitry, such as the transmitter 133.

The directional coupler 124 can be positioned between the output of the power amplifier 132 and the source of the series switch transistor 125, thereby allowing an output power measurement of the power amplifier 132 that does not include insertion loss of the series switch transistor 125. The sensed output signal from the directional coupler 124 can be provided to the mixer 138, which can multiply the sensed output signal by a reference signal of a controlled frequency so as to downshift the frequency content of the sensed output signal to generate a downshifted signal. The downshifted signal can be provided to the ADC 139, which can convert the downshifted signal to a digital format suitable for processing by the baseband processor 134.

By including a feedback path between the output of the power amplifier 132 and the baseband processor 134, the baseband processor 134 can be configured to dynamically adjust the I and Q signals to optimize the operation of the power amplifier system 140. For example, configuring the power amplifier system 140 in this manner can aid in controlling the power added efficiency (PAE) and/or linearity of the power amplifier 132.

In the illustrated configuration, the charge pumps 122 provide a positive charge pump voltage and a negative charge pump voltage to the level shifter 123. In certain configurations (for instance, when the switches are implemented using n-type transistors), the positive charge pump voltage is used to bias the gate voltage of the series switch transistor 125 and/or the shunt switch transistor 126 when turned on, while the negative charge pump voltage is used to bias the gate voltage of the series switch transistor 125 and/or the shunt switch transistor 126 when turned off.

Although the series switch transistor 125 and the shunt switch transistor 126 are each depicted as a single transistor, typically a stack of transistors is used to implement each of the series switch transistor 125 and the shunt switch transistor 126. For example, stacking transistors aids in meeting a desired power handling capability. The level shifter 123 controls the gate voltage of the series switch transistor 125 through the first gate resistor 128 and controls the gate voltage of the shunt switch transistor 126 through the second gate resistor 129. Other biasing details of the series switch transistor 125 and the shunt switch transistor 126 are not depicted in FIG. 4 for clarity of the drawing.

In certain applications, such as RF switching systems, charge pumps can be specified to source or sink large currents to charge or discharge a capacitive load. For example, in an RF switching system, a negative charge pump can discharge a switch gate in response to an RF switch being transitioned from an ON state to an OFF state.

Provided herein are charging and discharging assistance circuits for charge pumps. In certain embodiments, a charge pump assistance circuit is temporarily activated (for example, by a pulse) when a charge pump is transitioning a voltage of a load from a first voltage level to a second voltage level. For example, in an RF switching application, the load is an RF FET switch with the first voltage level corresponding to the switch's ON state voltage and the second voltage level corresponding to the switch's OFF state voltage (for example, the steady-state output voltage of the charge pump).

By implementing a charge pump with charging and/or discharging assistance, the size of the charge pump's output storage capacitor can be reduced. For example, when a charge pump cannot deliver enough current (from the charge pump's regular DC-to-DC voltage conversion operation), the storage capacitor provides the missing charge. To avoid the charge pump's output voltage from collapsing in response to a large current draw, a storage capacitor can have a large size (for example, much larger than the load capacitor), which is undesirable for space reasons. By implementing a charge pump with a charge pump assistance circuit, a size of the charge pump's storage capacitor can be reduced.

Figure 5A:
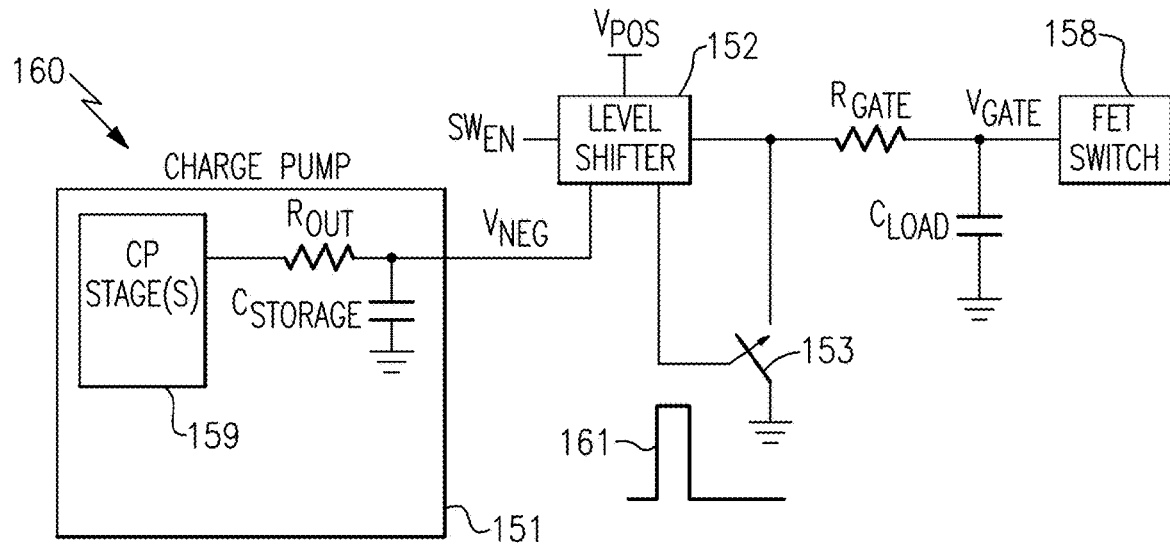
FIG. 5A is a schematic diagram of one embodiment of a charge pump system with discharging assistance.

FIG. 5A is a schematic diagram of one embodiment of a charge pump system 160 with discharging assistance. The charge pump system 160 includes a charge pump 151, a level shifter 152, an RF field effect transistor (FET) switch 158 (having a load capacitance represented by $C_{LOAD}$), a gate resistor $R_{GATE}$, and a charge pump assistance switch 153.

As shown in FIG. 5A, the charge pump 151 includes one or more charge pump stages 159 that collectively provide a negative charge pump voltage $V_{NEG}$ to the level shifter 152 by way of an output resistor $R_{OUT}$. The charge pump 151 also includes a storage capacitor $C_{STORAGE}$ connected between the negative charge pump voltage $V_{NEG}$ and ground.

The level shifter 152 controls a voltage level of a gate voltage VGATE of the RF FET switch 158 based on a state of a switch enable signal $SW_{EN}$. In the illustrated embodiment, the level shifter 152 controls the gate voltage VGATE to the positive charge pump voltage $V_{POS}$ in a first state of the switch enable signal $SW_{EN}$, and to the negative charge pump voltage $V_{NEG}$ in a second state of the switch enable signal $SW_{EN}$.

For a given drive strength of the charge pump 151 (for example, for a given size of a flying capacitor and frequency of operation of the charge pump stages 159), the size of the storage capacitor $C_{STORAGE}$ defines the response time when switching the capacitive load $C_{LOAD}$.

For example, with a smaller capacitor, the charge pump voltage $V_{NEG}$ initially collapses more and limits the output voltage change in response to a load voltage transition, but it provides less load to the charge pump 151 to recharge and thus the long term settling is faster. When using a smaller capacitor, one design consideration is that the voltage drop/collapse remains small enough for the level shifter 152 to maintain proper operation.

In contrast, for a larger storage capacitor, less initial voltage drop occurs but the charge pump 151 has slower settling time. Moreover, the area of a storage capacitor can be the main area consumer for a silicon on insulator (SOI) switch application, and should be reduced as much as possible. Furthermore, there is a tradeoff between storage capacitor size with the ripple on the charge pump, which could lead to noise on the RF path through the RF FET switch.

The challenges of the charge pump 151 are particularly exacerbated for an implementation in which the RF FET switch 158 is an n-type metal oxide semiconductor (NMOS) transistor that is transitioned from ON to OFF. For example, an NMOS transistor has a gate capacitance profile that increases with gate voltage (for example, has a low capacitance value below the threshold voltage and a high capacitance value above the threshold voltage) due to transistor biasing, doping, and/or construction characteristics. Such an NMOS transistor has a highest capacitance when the switch FET is ON (for example, biased at $V_{POS}$ of 2.5V or 3.5V, for instance), and a lower capacitance (for example, a factor of 2 to 5× smaller) when the FET is OFF (for example, biased at $V_{NEG}$ of −2.5V, for instance).

In the illustrated embodiment, the charge pump assistance switch 153 is included between the output of the level shifter 152 and ground. The charge pump assistance switch 153 is temporarily activated by a pulse 161 that is generated (by the level shifter 152, in this example) in response to a transition of the switch enable signal $SW_{EN}$ indicating that the gate voltage VGATE of the RF FET switch 158 is to be transitioned from $V_{POS}$ to $V_{NEG}$.

By implementing the charge pump system 160 in this manner, the charge of the load capacitor $C_{LOAD}$ (which is initially equal to the larger on-state gate capacitance of the RF FET switch 158) is diverted to ground through the charge pump assistance switch 153 rather than absorbed by the charge pump 151. Accordingly, the charge pump 151 need only supply the charge after the load capacitor $C_{LOAD}$ is partially discharged, for instance, below the threshold voltage of the RF FET switch 158 (which can result in the smaller off-state gate capacitance of the RF FET switch 158).

Accordingly, since the amount of charge supplied by the charge pump 151 is relaxed, a size and area of the storage capacitor $C_{STORAGE}$ can be reduced.

In certain implementations, the level shifter 152 provides a high impedance (Z) output when the pulse 161 is active (and thus when the switch 153 is on). By including the high Z output feature, a short between the charge pump's output ($V_{NEG}$) and ground is prevented, and a risk of collapsing $V_{NEG}$ to ground is avoided. The high Z output control can be linked to the control of the switch 153 (for example, the high Z output feature can be enabled by the pulse 161).

Additionally, the width of the pulse 161 (and the turn on of the switch 153 and high Z output of the level shifter 152) can be enabled for a short period of time, which can be selected based on a given load. In certain implementations, the width of the pulse 161 is controllable, for instance, based on data programmed over a serial interface and/or based on fuses or other non-volatile settings.

Figure 5B:
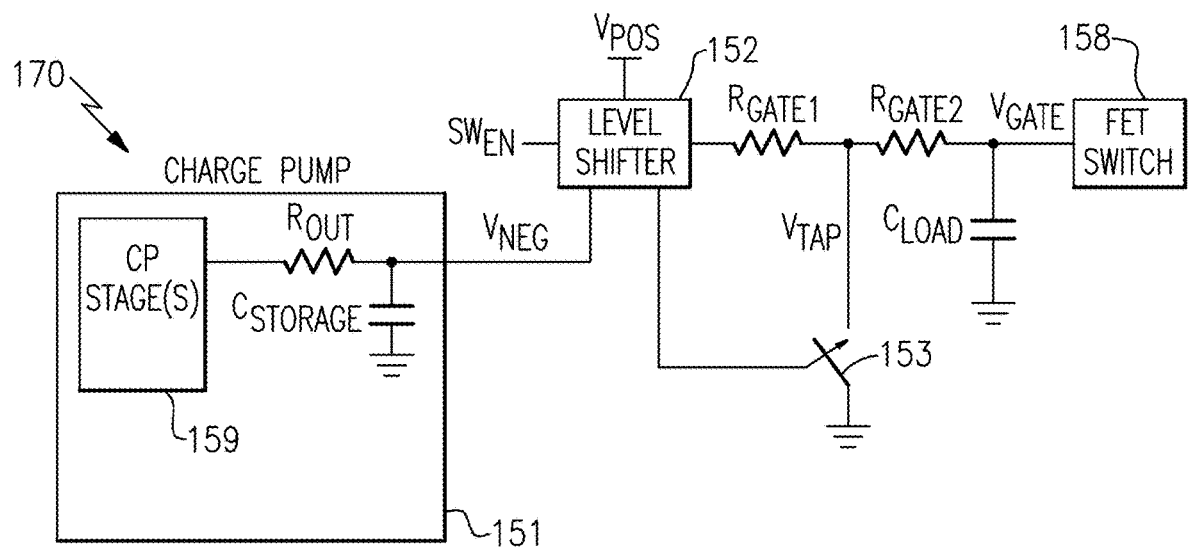
FIG. 5B is a schematic diagram of another embodiment of a charge pump system with discharging assistance.

FIG. 5B is a schematic diagram of another embodiment of a charge pump system 170 with discharging assistance. The charge pump system 170 of FIG. 5B is similar to the charge pump system 160 of FIG. 5A, except that the charge pump system 170 partitions the gate resistor $R_{GATE}$ of FIG. 5A into a first gate resistor $R_{GATE1}$ and a second gate resistor $R_{GATE2}$, with the charge pump assistance switch 153 connected at an intermediate or tap node (having voltage $V_{TAP}$) between the first gate resistor $R_{GATE1}$ and the second gate resistor $R_{GATE2}$.

By reducing the resistance between the charge pump assistance switch 153 and the gate of the RF FET switch 158, the resistor-capacitor (RC) time constant associated with the charge pump assistance switch 153 discharging the load capacitor $C_{LOAD}$ is reduced. Moreover, such reduction in discharge time is achieved without degrading the benefits that the gate resistance provides, such as high isolation between the RF FET switch 158 and the level shifter 152. For example, a sum of the resistances of the first gate resistor $R_{GATE1}$ and the second gate resistor $R_{GATE2}$ of FIG. 5B can be chosen to be equal to the resistance of the gate resistor $R_{GATE}$ of FIG. 5B, such that isolation between the RF FET switch 158 and the level shifter 152 is not degraded.

Figure 5C:
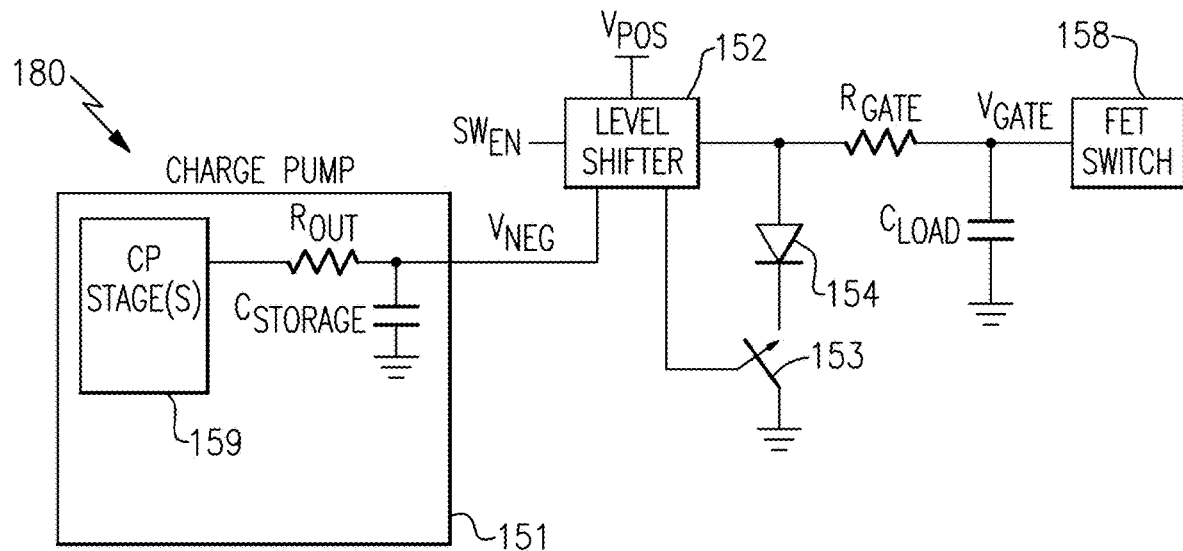
FIG. 5C is a schematic diagram of another embodiment of a charge pump system with discharging assistance.

FIG. 5C is a schematic diagram of another embodiment of a charge pump system 180 with discharging assistance. The charge pump system 180 of FIG. 5C is similar to the charge pump system 160 of FIG. 5A, except that the charge pump system 180 further includes a diode 154 in series with the charge pump assistance switch 153.

In the illustrated embodiment, the charge pump assistance switch 153 discharges the load capacitance $C_{LOAD}$ to ground while VGATE is greater than the forward voltage $V_{DIODE}$ of the diode 154.

The diode 154 provides a number of functions, including preventing any current from accidentally flowing through the switch 153 when the switch 153 is intended to be OFF (for example, an NMOS-based switch could be turning ON when VGATE becomes negative, as its gate could be 0V and thus the gate-to-source voltage for reverse conduction would be greater than the threshold voltage). Additionally, the diode 154 provides a voltage drop from $V_{POS}$ (when $V_{POS}$ is provided to the RF FET switch 158) to increase the reliability of the switch 153 (for example, maintaining a drain-to-source voltage below a maximum rated operating voltage).

In certain implementations, the diode 154 corresponds to a p-n junction diode. However, other types of diodes or non-diode implementations are possible. For example, in another implementation, a MOS transistor connected as a diode (with a floating body or a body controlled to avoid turn on of parasitic body-drain junctions) is used. In yet another implementation, an actively-controlled FET is used.

Figure 5D:
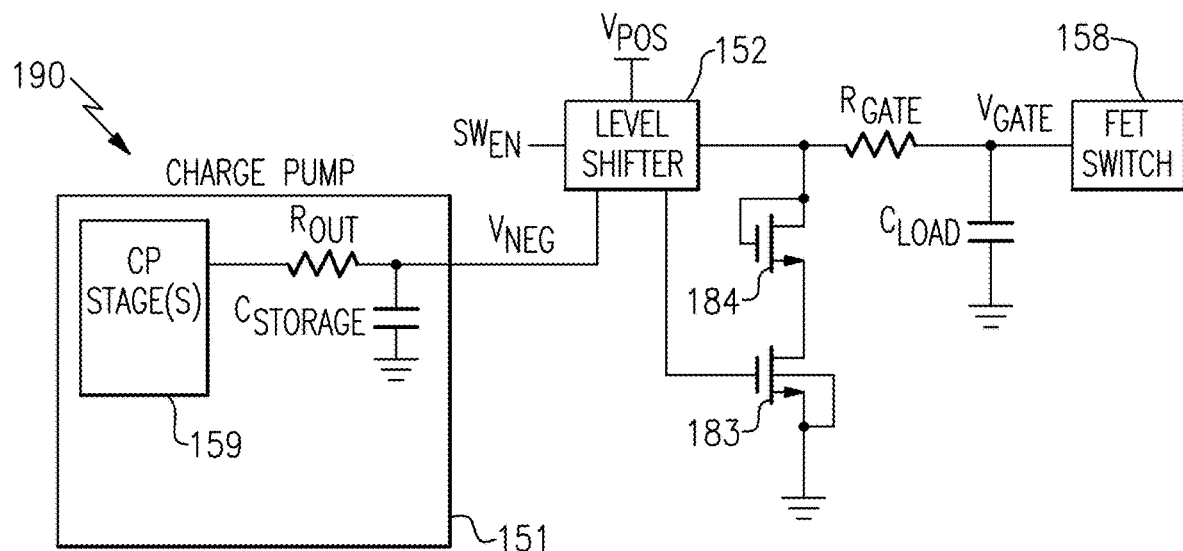
FIG. 5D is a schematic diagram of another embodiment of a charge pump system with discharging assistance.

FIG. 5D is a schematic diagram of another embodiment of a charge pump system 190 with discharging assistance. The charge pump system 190 of FIG. 5D is similar to the charge pump system 160 of FIG. 5A, except that the charge pump system 190 implements the switch 153 as an NFET 183. Additionally, the charge pump system 190 further includes a diode-connected NFET 184 in series with the NFET 183.

In this implementation, the NFET 183 has a body voltage tied to ground and the diode-connected NFET 184 has a floating body voltage to avoid activating parasitic p-n junctions associated with the body and to help match the threshold voltage of the NFET 184 to the threshold voltage of the NFET 183.

Figure 6:
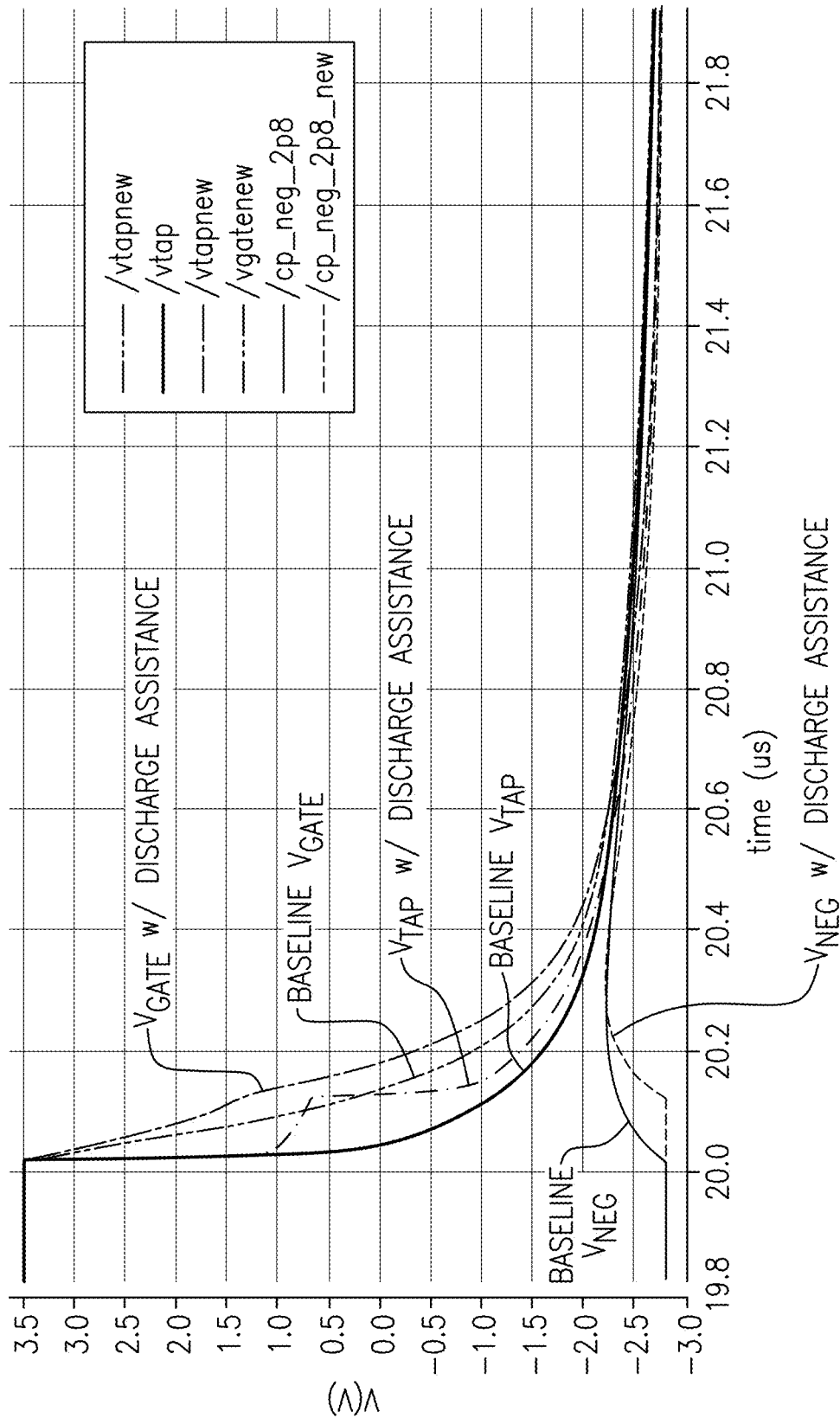
FIG. 6 is a graph of one example of a transient simulation for a charge pump system with discharging assistance.

FIG. 6 is a graph of one example of a transient simulation for a charge pump system with discharging assistance. The graph includes plots of voltage versus time for VGATE, $V_{TAP}$, and $V_{NEG}$ for an implementation of FIG. 5B compared to a baseline simulation in which the charge pump assistance switch 153 is not activated and in which $C_{STORAGE}$ is doubled.

As shown in FIG. 6, the $V_{NEG}$ peak voltages are about the same even though the storage capacitor $C_{STORAGE}$ is only half the value of the baseline case when simulating with the discharge assistance circuitry. Moreover, similar switching time and faster settling are provided when the discharge assistance circuitry is included.

Figure 7:
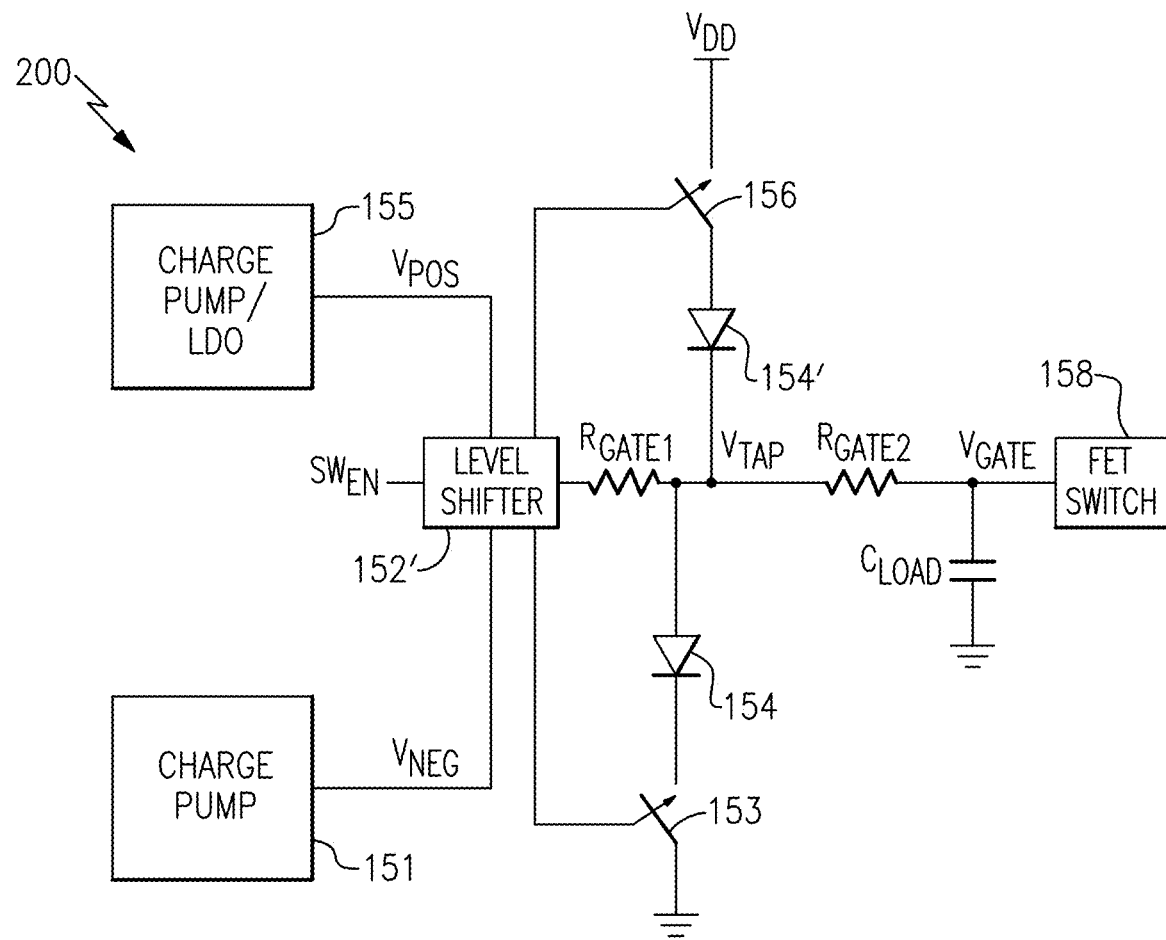
FIG. 7 is a schematic diagram of another embodiment of a charge pump system with charging and discharging assistance.

FIG. 7 is a schematic diagram of another embodiment of a charge pump system 200 with charging and discharging assistance. The charge pump system 200 includes a negative charge pump 151, a level shifter 152', a discharge assistance switch 153, a first diode 154, a second diode 154', a positive charge pump and/or low dropout (positive charge pump/LDO) regulator 155, a charging assistance switch 156, an RF FET switch 158, a first gate resistor $R_{GATE1}$, and a second gate resistor $R_{GATE2}$.

In comparison to the embodiments of FIGS. 5A-5D, the positive charge pump/LDO regulator 155 is included for generating the positive voltage $V_{POS}$. Additionally, the charging assistance switch 156 and second diode 154' are included between $V_{DD}$ and $V_{TAP}$ to assist the positive charge pump/LDO regulator 155 in charging VGATE during a transition from low to high. The level shifter 152' generates a pulse for controlling the charging assistance switch 156, and can be high Z output while the pulse turns on the charging assistance switch 156.

Figure 8:
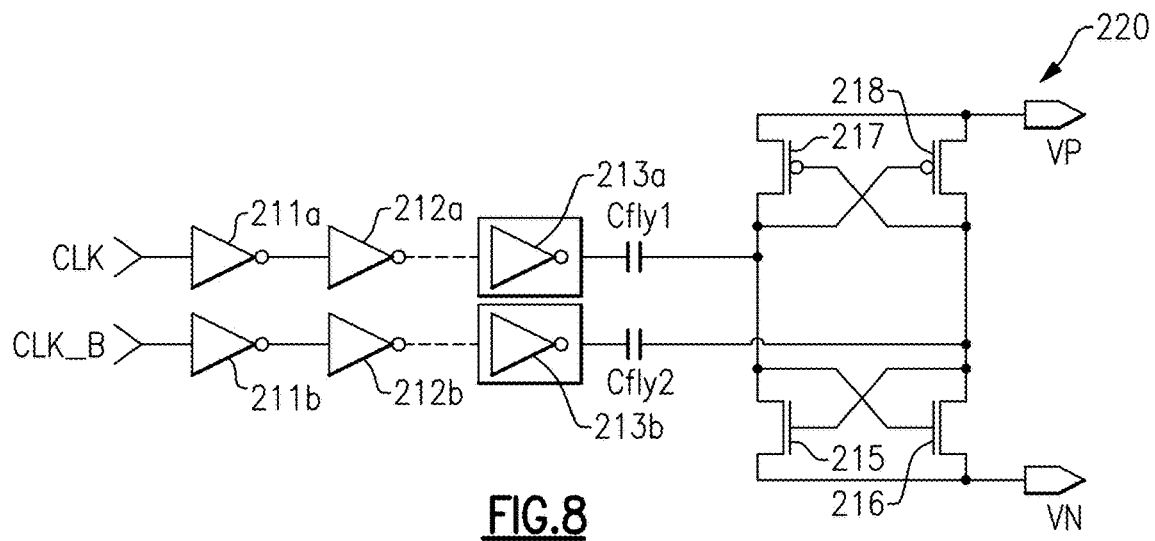
FIG. 8 is a schematic diagram of one embodiment of a charge pump.

FIG. 8 is a schematic diagram of one embodiment of a charge pump 220. The charge pump 220 includes a first group of clock inverters 211*a*/212*a*/213*a*, a second group of clock inverters 211*b*/212*b*/213*b*, a first flying capacitor Cfly1, a second flying capacitor Cfly2, a first NMOS transistor 215, a second NMOS transistor 216, a first p-type metal oxide semiconductor (PMOS) transistor 217, and a second PMOS transistor 218.

With continuing reference to FIG. 8, the charge pump 220 includes a first clock input CLK for receiving a non-inverted clock signal for driving the first group of clock inverters 211*a*/212*a*/213*a*, and a second clock input CLK_B for receiving an inverted clock signal for driving the second group of clock inverters 211*b*/212*b*/213*b*. The first group of clock inverters 211*a*/212*a*/213*a* are sized to buffer the non-inverted clock signal to provide a drive strength sufficient for driving a first end of the first flying capacitor Cfly1. Similarly, the second group of clock inverters 211*b*/212*b*/213*b* are sized to buffer the inverted clock signal to provide a drive strength sufficient for driving a first end of the second flying capacitor Cfly2. The clock inverter groups can include any suitable number of inverters, and can be scaled in any suitable manner. In certain implementations, the buffered clock signals used to drive the flying capacitors correspond to a pair of non-overlapping clock signals.

As shown in FIG. 8, the charge pump 220 includes a first terminal VP and a second terminal VN. Based on the connectivity of the first terminal VP and the second terminal VN, the charge pump 220 can serve as either a positive charge pump (generating $V_{POS}$ at the first terminal VP with a boosted voltage relative to the second terminal VN, for instance, connected to a normal supply voltage provided to a pin of a die) or a negative charge pump (generating $V_{NEG}$ at the second terminal VN with a reduced or buck voltage relative to the first terminal VP, for instance, connected to ground).

Figure 9:
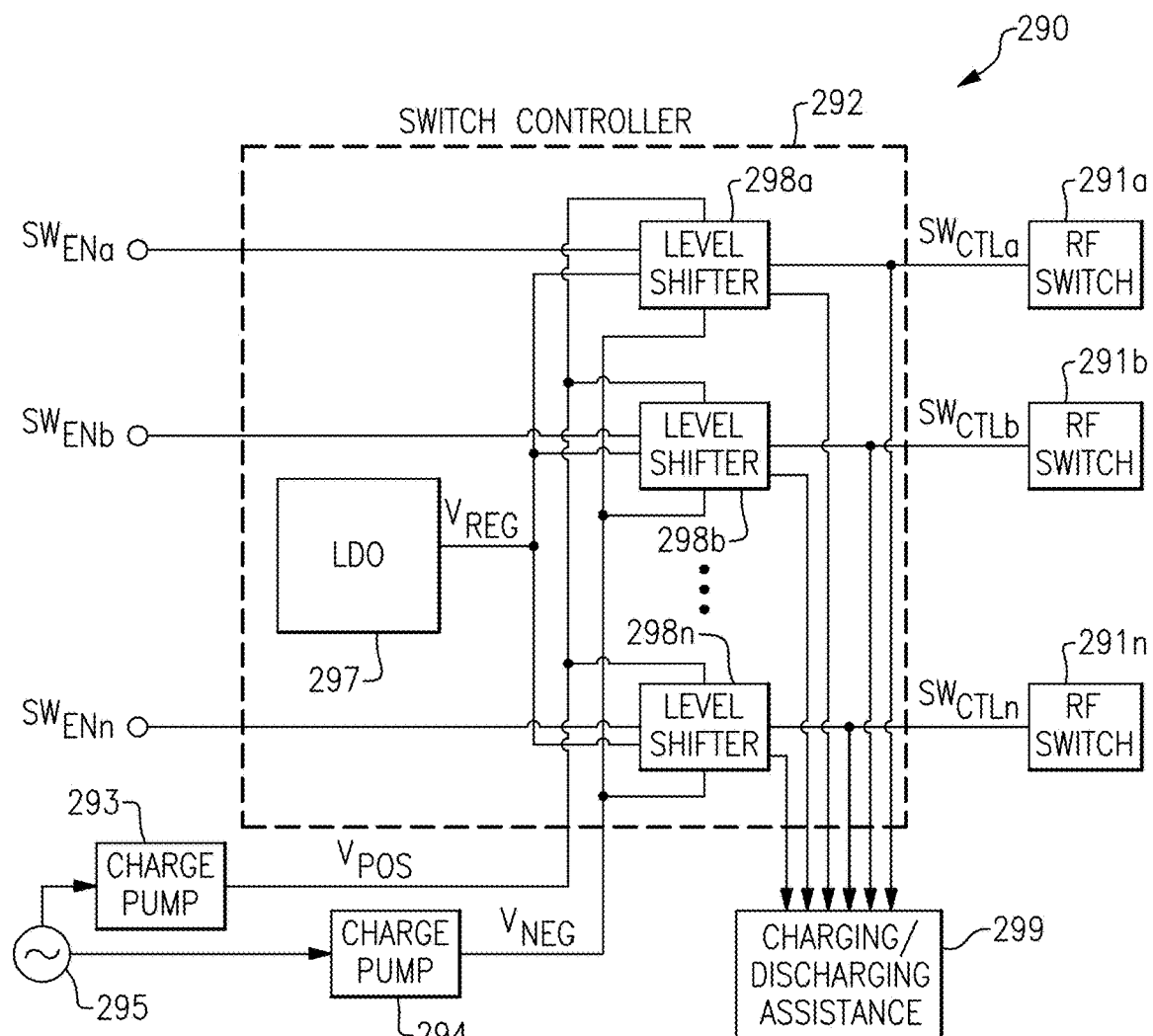
FIG. 9 is a schematic block diagram of a radio frequency (RF) switch system according to one embodiment.

FIG. 9 is a schematic block diagram of an RF switch system 290 according to one embodiment. The RF switch system 290 includes RF switches 291*a*, 291*b*, . . . 291*n*, a switch controller 292, a positive charge pump 293 that generates a positive charge pump voltage $V_{POS}$, a negative charge pump 294 that generates a negative charge pump voltage $V_{NEG}$, a charge pump clock generator 295, and a charging and/or discharging assistance circuit 299.

As shown in FIG. 9, the switch controller 292 includes a voltage regulator (corresponding to a low dropout regulator 297, in this example) that generates a regulated voltage VREG, and level shifters 298*a*, 298*b*, . . . 298*n*.

The level shifters 298*a*, 298*b*, . . . 298*n* operate to level shift the switch enable signals $SW_{ENa}$, $SW_{ENb}$, . . . $SW_{ENn}$ to generate the switch control signals $SW_{CTLa}$, $SW_{CTLb}$, . . . $SW_{CTLn}$ for the RF switches 291*a*, 291*b*, . . . 291*n*, respectively. As shown in FIG. 9, the level shifters 298*a*, 298*b*, . . . 298*n* each receive the regulated voltage VREG, the positive charge pump voltage $V_{POS}$, and the negative charge pump voltage $V_{NEG}$. Additionally, the charge pump clock generator 295 generates clock signals for the positive charge pump 293 and the negative charge pump 294.

Although the illustrated RF switch system 290 includes three level shifters and three switches, any number of level shifters and switches can be included.

As shown in FIG. 9, the charging and/or discharging assistance circuit 299 has been included to aid the positive charge pump 293 and/or the negative charge pump 294 in charging and/or discharging the gate capacitances associated with the RF switches 291*a*, 291*b*, . . . 291*n*. The charging and/or discharging assistance circuit 299 can be implemented in accordance with any of the embodiments herein.

Figure 10A:
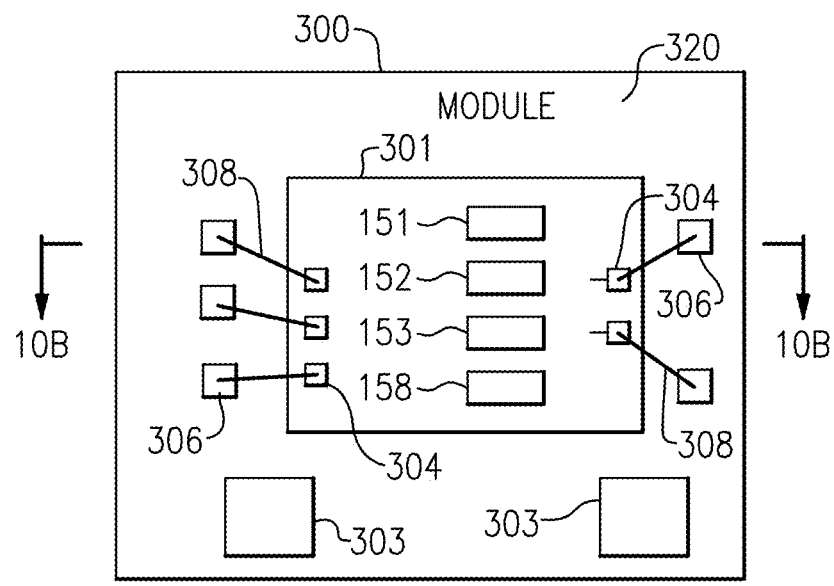
FIG. 10A is a schematic diagram of one embodiment of a packaged module.
Figure 10B:
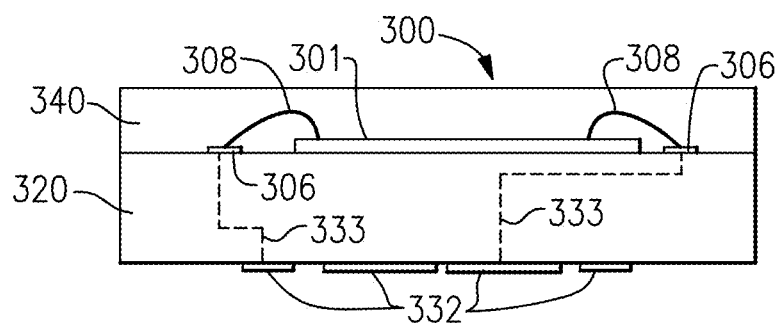
FIG. 10B is a schematic diagram of a cross-section of the packaged module of FIG. 10A taken along the lines 10B-10B.

FIG. 10A is a schematic diagram of one embodiment of a packaged module 300. FIG. 10B is a schematic diagram of a cross-section of the packaged module 300 of FIG. 10A taken along the lines 10B-10B.

The packaged module 300 includes an IC or die 301, surface mount components 303, wirebonds 308, a package substrate 320, and encapsulation structure 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

As illustrated in FIGS. 10A and 10B, the die 301 includes a charge pump 151, a level shifter 152, a discharge assistance switch 153, and an RF FET switch 158, which can be as described earlier in connection with any of the embodiments herein.

The packaging substrate 320 can be configured to receive a plurality of components such as the die 301 and the surface mount components 303, which can include, for example, surface mount capacitors and/or inductors.

As shown in FIG. 10B, the packaged module 300 is shown to include a plurality of contact pads 332 disposed on the side of the packaged module 300 opposite the side used to mount the die 301. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 10B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 11:
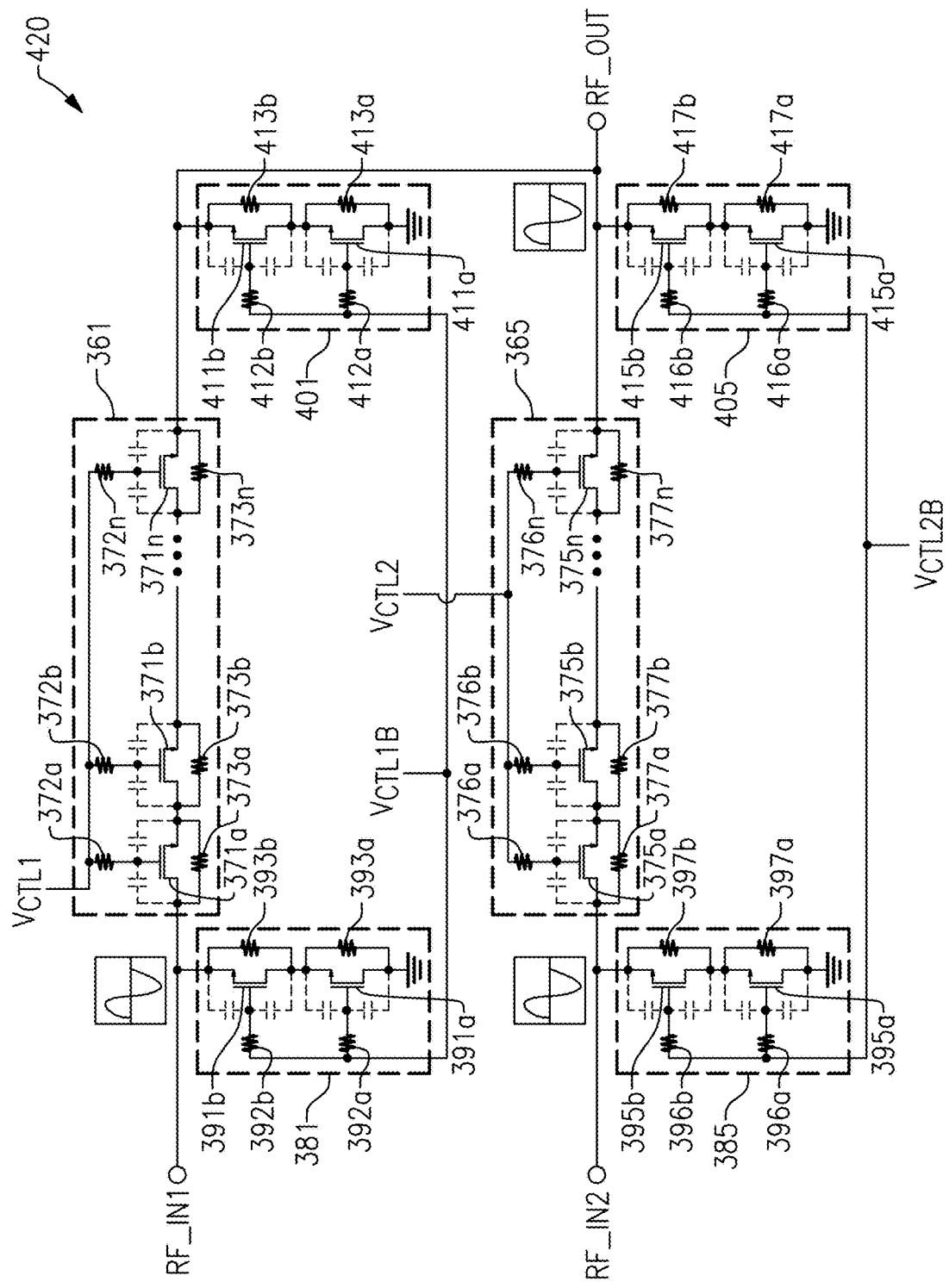
FIG. 11 is a schematic diagram of an RF switch network according to another embodiment.

FIG. 11 is a schematic diagram of an RF switch network 420 according to another embodiment. The RF switch network 420 includes a first series transistor switch 361, a second series transistor switch 365, a first input shunt transistor switch 381, a second input shunt transistor switch 385, a first output shunt transistor switch 401, and a second output shunt transistor switch 405.

The RF switch network 420 of FIG. 11 illustrates another embodiment of an RF switch network suitable for use in an RF switch system, such as the RF switch system 120 of FIG. 4. However other implementations are possible, including, but not limited, RF switch networks including more or fewer series transistor switches and/or more or fewer shunt transistor switches.

In the illustrated embodiment, the first series transistor switch 361 is electrically connected between a first RF input terminal RF_IN1 and an RF output terminal RF_OUT, and the second series transistor switch 365 is electrically connected between a second RF input terminal RF_IN2 and the RF output terminal RF_OUT. Additionally, the first input shunt transistor switch 381 is electrically connected between the first RF input terminal RF_IN1 and ground, and the second input shunt transistor switch 385 is electrically between the second RF input terminal RF_IN2 and ground. Furthermore, the first output shunt transistor switch 401 is electrically connected between the RF output terminal RF_OUT and ground, and the second output shunt transistor switch 405 is electrically connected between the RF output terminal RF_OUT and ground.

As shown in FIG. 11, a first switch control voltage $V_{CTL1}$ controls the first series transistor switch 361, and a first inverted switch control voltage $V_{CTLB1}$ controls the first input shunt transistor switch 381 and the first output shunt transistor switch 401. Furthermore, a second switch control voltage $V_{CTL2}$ controls the second series transistor switch 365, and a second inverted switch control voltage $V_{CTLB2}$ controls the second input shunt transistor switch 385 and the second output shunt transistor switch 405. In certain implementations, a first level shifter generates the first switch control voltage $V_{CTL1}$ and the first inverted switch control voltage $V_{CTLB1}$, while a second level shifter generates the second switch control voltage $V_{CTL2}$ and the second inverted switch control voltage $V_{CTLB2}$.

The depicted transistor switches each include a number of transistors in series (also referred to herein as stacked transistors) to achieve a desired power handling capability, with the transistors biased used corresponding gate resistors and channel resistors.

For example, the first series transistor switch 361 includes NFETs 371a, 371b, . . . 371n, gate resistors 372a, 372b, . . . 372n, and channel resistors 373a, 373b, . . . 373n. Additionally, the second series transistor switch 365 includes NFETs 375a, 375b, . . . 375n, gate resistors 376a, 376b, . . . 376n, and channel resistors 377a, 377b, . . . 377n. Furthermore, the first input shunt transistor switch 381 includes NFETs 391a, 391b, gate resistors 392a, 392b, and channel resistors 393a, 393b. Additionally, the second input shunt transistor switch 385 includes NFETs 395a, 395b, gate resistors 396a, 396b, and channel resistors 397a, 397b. Furthermore, the first output shunt transistor switch 401 includes NFETs 411a, 411b, gate resistors 412a, 412b, and channel resistors 413a, 413b. Additionally, the second output shunt transistor switch 405 includes NFETs 415a, 415b, gate resistors 416a, 416b, and channel resistors 417a, 417b.

The charging and discharging assistance herein can be used for any suitable RF switch structure, including stacked transistor structures employing series and shunt branches such as in FIG. 11.

Figure 12:
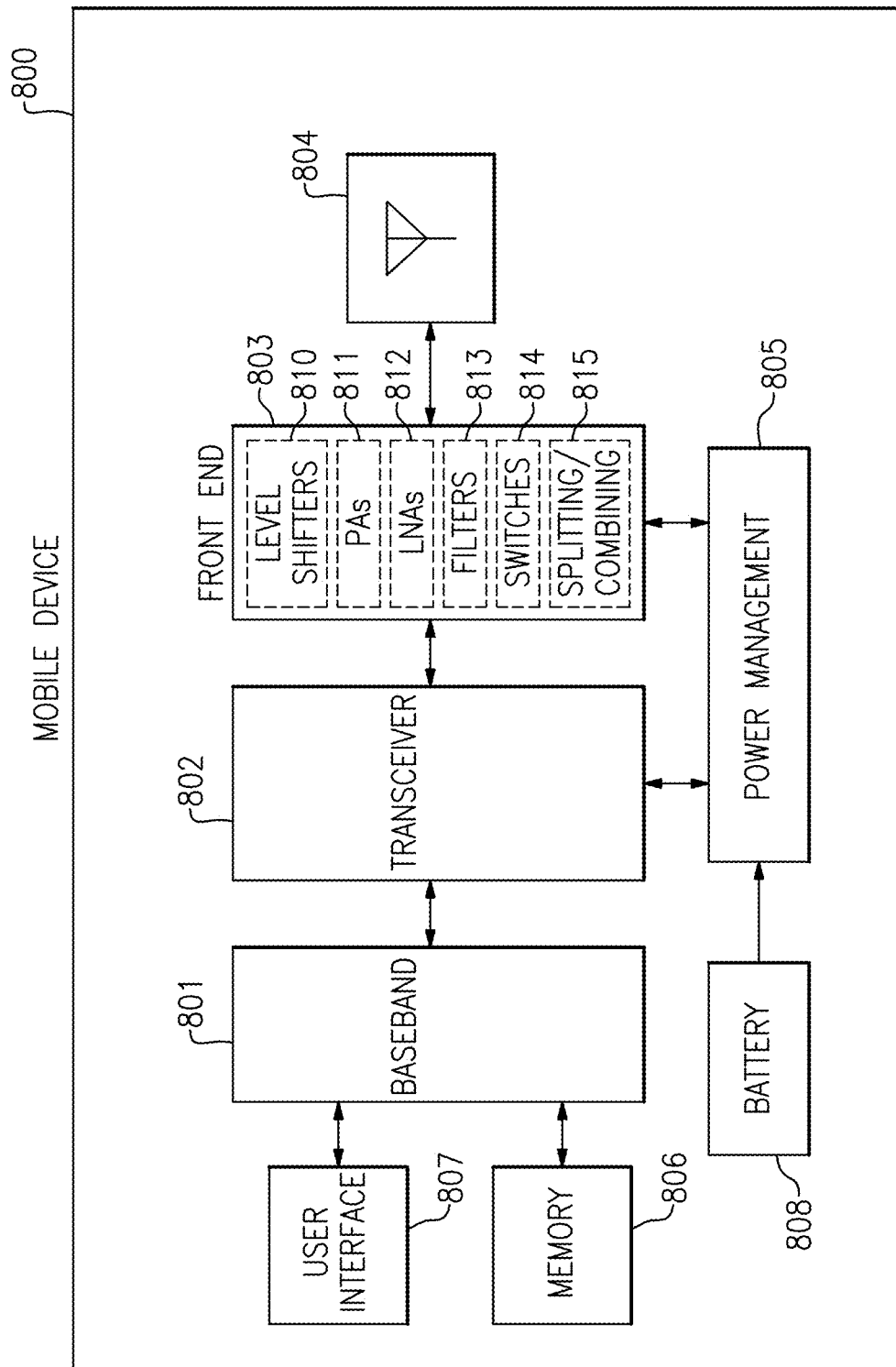
FIG. 12 is a schematic diagram of one embodiment of a mobile device.

FIG. 12 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 12 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes level shifters 810, power amplifiers (PAS) 811, low noise amplifiers (LNAs) 812, filters 813, switches 814, and signal splitting/combining circuitry 815. However, other implementations are possible. The front end system 803 can be implemented with charging/discharging assistance for the switches 814 in accordance with any of the embodiments herein.

The front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 12, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 12, the power management system 805 receives a battery voltage from the battery 808. The battery 808 can be any suitable battery for use in the mobile device 800, including, for example, a lithium-ion battery.

CONCLUSION

Some of the embodiments described above have provided examples in connection with mobile devices. However, the principles and advantages of the embodiments can be used for any other systems or apparatus that have needs for RF switching.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front end system for a mobile device, the front end system comprising:
    a radio frequency field-effect transistor switch having a source configured to receive a radio frequency signal and a gate configured to receive a switch control signal;
    a level shifter powered by a first supply voltage and a second supply voltage, the lever shifter including an input configured to receive a switch enable signal and an output configured to provide the switch control signal;
    a first resistor connected between the output of the level shifter and a tap node;
    a second resistor connected between the tap node and the gate of the radio frequency field-effect transistor switch; and
    a first assistance switch connected between the tap node and a ground voltage and configured to activate in response to a transition of the switch enable signal from a first state to a second state.

2. The front end system of claim 1 wherein the first supply voltage is a negative voltage less than the ground voltage, and the second supply voltage is a positive voltage greater than the ground voltage.

3. The front end system of claim 1 further comprising a diode connected in series with the first assistance switch between the tap node and the ground voltage.

4. The front end system of claim 3 wherein the diode has an anode connected to the tap node, the first assistance switch including a first field-effect transistor having a drain connected to a cathode of the diode and a source connected to the ground voltage.

5. The front end system of claim 3 wherein the diode is a diode-connected transistor having a drain and a gate connected to the tap node and a source connected to the first assistance switch.

6. The front end system of claim 1 further comprising a second assistance switch connected between the tap node and a third supply voltage and configured to activate in response to the switch enable signal transitioning from the second state to the first state.

7. The front end system of claim 6 further comprising a first diode connected in series with the first assistance switch between the tap node and the ground voltage, and a second diode connected in series with the second assistance switch between the third supply voltage and the tap node.

8. The front end system of claim 7 wherein the first diode has an anode connected to the tap node and the second diode has a cathode connected to the tap node.

9. The front end system of claim 1 further comprising a power amplifier configured to output the radio frequency signal.

10. A mobile device comprising:
    a power management system configured to generate a first supply voltage and second supply voltage; and
    a front end system including a radio frequency field-effect transistor switch having a source configured to receive a radio frequency signal and a gate configured to receive a switch control signal, a level shifter powered by the first supply voltage and the second supply voltage and including an input configured to receive a switch enable signal and an output configured to provide the switch control signal, a first resistor connected between the output of the level shifter and a tap node, a second resistor connected between the tap node and the gate of the radio frequency field-effect transistor switch, and a first assistance switch connected between the tap node and a ground voltage and configured to activate in response to a transition of the switch enable signal from a first state to a second state.

11. The mobile device of claim 10 wherein the front end system further includes a diode connected in series with the first assistance switch between the tap node and the ground voltage.

12. The mobile device of claim 11 wherein the diode has an anode connected to the tap node, the first assistance switch including a first field-effect transistor having a drain connected to a cathode of the diode and a source connected to the ground voltage.

13. The mobile device of claim 10 further comprising a second assistance switch connected between the tap node and a third supply voltage and configured to activate in response to the switch enable signal transitioning from the second state to the first state.

14. The mobile device of claim 10 wherein the first supply voltage is a negative voltage less than the ground voltage, and the second supply voltage is a positive voltage greater than the ground voltage.

15. The mobile device of claim 14 wherein the power management system includes a negative charge pump configured to generate the negative voltage.

16. A method of level shifting in a mobile device, the method comprising:
    receiving a radio frequency signal at a source of a radio frequency field-effect transistor switch and a switch control signal at a gate of the radio frequency field-effect transistor switch;
    powering a level shifter using a first supply voltage and a second supply voltage;
    receiving a switch enable signal at an input to the lever shifter and providing the switch control signal at an output of the level shifter, the output of the level shifter connected to a tap node through a first resistor and the tap node connected to the gate of the radio frequency field-effect transistor switch through a second resistor; and
    activating a first assistance switch in response to a transition of the switch enable signal from a first state to a second state, the first assistance switch connected between the tap node and a ground voltage.

17. The method of claim 16 further comprising preventing a flow of current using a diode connected in series with the first assistance switch between the tap node and the ground voltage.

18. The method of claim 16 further comprising activating a second assistance switch in response to the switch enable signal transitioning from the second state to the first state, the second assistance switch connected between the tap node and a third supply voltage.

19. The method of claim 16 further comprising activating the charge pump assistance switch with a signal pulse generated by the level shifter.

20. The method of claim 19 further comprising providing a high output impedance to the level shifter during at least a portion of the signal pulse.

\* \* \* \* \*